United States Patent
Suzuki et al.

(10) Patent No.: US 8,723,562 B2
(45) Date of Patent: May 13, 2014

(54) DRIVE UNIT FOR REVERSE-CONDUCTING SWITCHING ELEMENT

(71) Applicant: Denso Corporation, Kariya (JP)

(72) Inventors: Tomotaka Suzuki, Nagoya (JP); Yoshiyuki Hamanaka, Kariya (JP); Ryotaro Miura, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/760,419

(22) Filed: Feb. 6, 2013

(65) Prior Publication Data

US 2013/0207712 A1 Aug. 15, 2013

(30) Foreign Application Priority Data

Feb. 13, 2012 (JP) ................................. 2012-028531

(51) Int. Cl.
*H03B 1/00* (2006.01)

(52) U.S. Cl.
USPC .......................................... 327/108; 327/379

(58) Field of Classification Search
None
See application file for complete search history.

(56) References Cited

U.S. PATENT DOCUMENTS

| 8,513,985 B2* | 8/2013 | Kimura ......................... 327/109 |
| 8,519,750 B2* | 8/2013 | Kimura et al. ................. 327/109 |
| 2009/0057832 A1 | 3/2009 | Kouno |
| 2012/0224288 A1* | 9/2012 | Uota et al. ...................... 361/79 |

FOREIGN PATENT DOCUMENTS

| JP | 3339311 | 8/2002 |
| JP | 2009-268054 | 11/2009 |

* cited by examiner

*Primary Examiner* — Cassandra Cox
(74) *Attorney, Agent, or Firm* — Nixon & Vanderhye PC

(57) ABSTRACT

In a drive unit for a reverse-conducting switching element which is a driven switching element, a process to transfer electric charges to a conductive control terminal of the driven switching element is performed on the basis of a turn-on command or a turn-off command, thereby turning on and off the driven switching element. A transfer rate of the electric charges is changed in a period from when the transfer of the electric charges to the conductive control terminal is started until when it is completed. While judged that forward current flows in a free-wheel diode, the electric charges are inhibited from being charged to the conduction control terminal which corresponds to the free-wheel diode in which the forward current is judged to flow. While the electric charges are inhibited from being charged to the conductive control terminal, a change of the transfer rate is disabled.

12 Claims, 10 Drawing Sheets

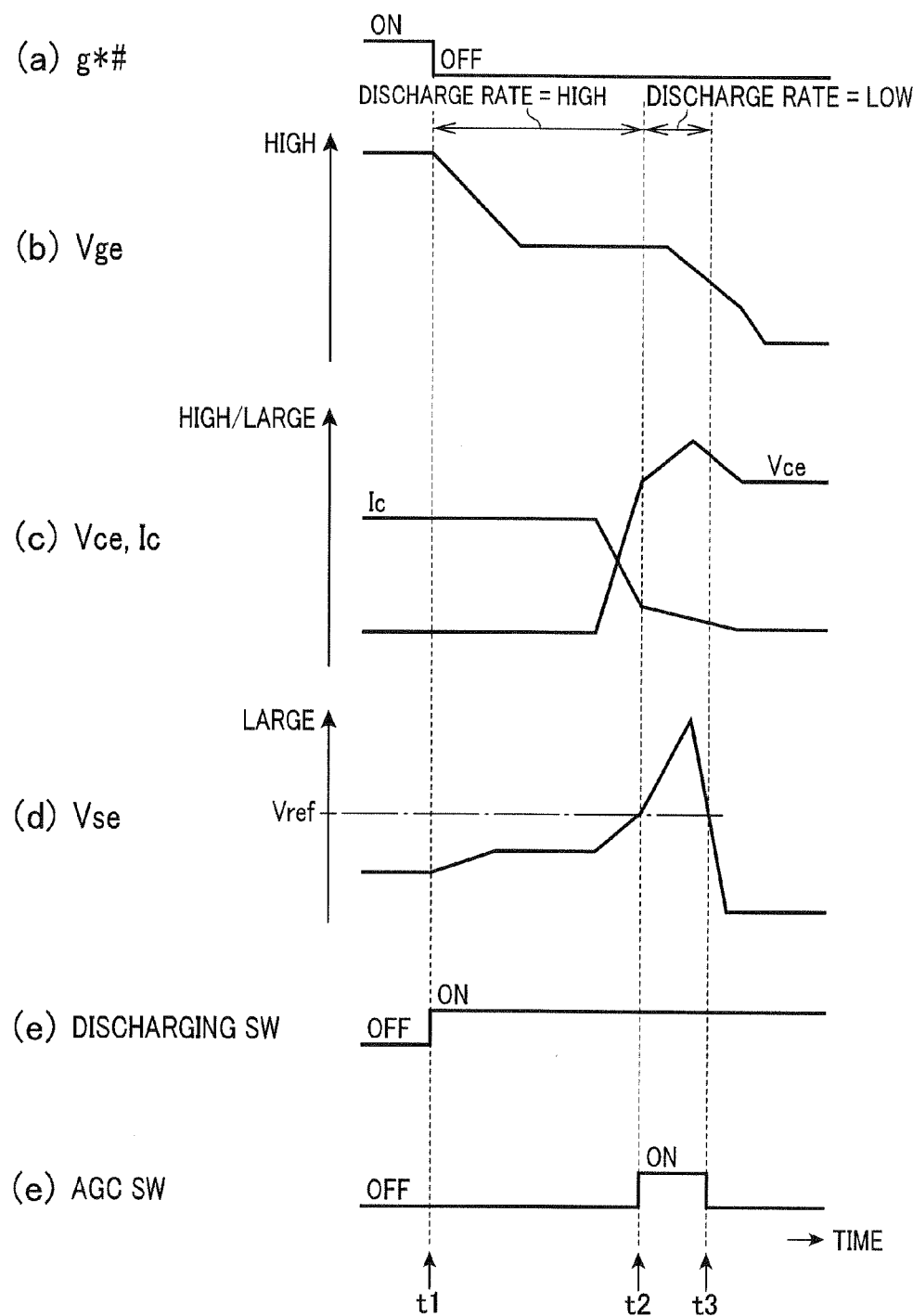

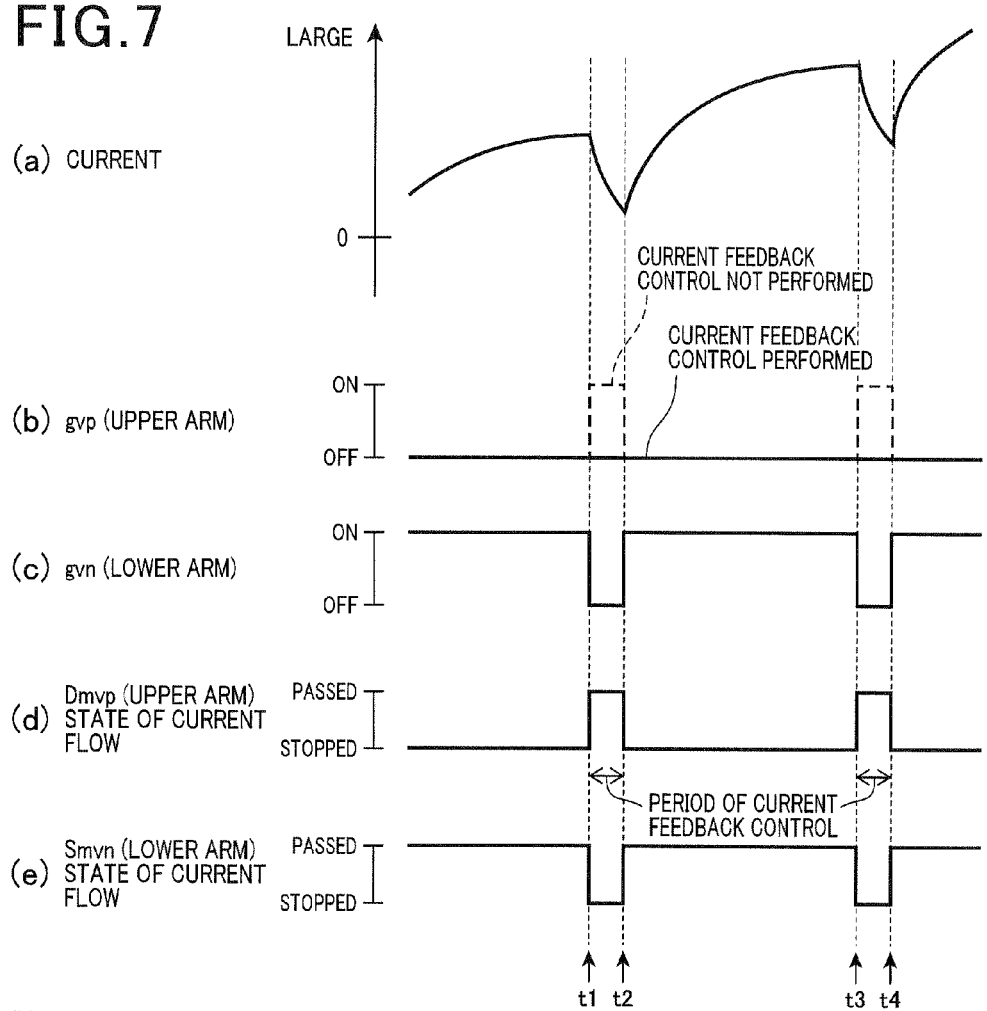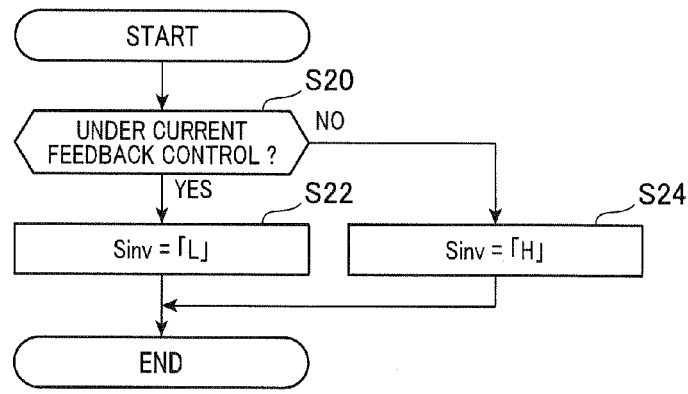

DRIVE UNIT FOR REVERSE-CONDUCTING SWITCHING ELEMENT

CROSS-REFERENCE TO RELATED APPLICATION

This application is based on and claims the benefit of priority from earlier Japanese Patent Application No. 2012-028531 filed Feb. 13, 2012, the description of which is incorporated herein by reference.

BACKGROUND

1. Technical Field

The present invention relates to a drive unit for a reverse-conducting switching element, the drive unit including a chip on which a voltage-controlled switching element is connected in anti-parallel to a free-wheel diode.

2. Related Art

In related arts, reverse-conducting insulated gate bipolar transistors (RC-IGBTs) incorporating a diode are well known. Such an RC-IGBT includes a chip on which an IGBT is connected in anti-parallel to a free-wheel diode. It is well known that, in an RC-IGBT, voltage drop in the free-wheel diode when forward current passes therethrough increases with the application of a voltage to the gate of the RC-IGBT. The increase of voltage drop accelerates power loss in the free-wheel diode when forward current passes therethrough. The acceleration of the power loss may lead to the increase of heat generated by the RC-IGBT. Resultantly, the reliability of the RC-IGBT may be impaired.

A technique as a measure against this problem is also well known as disclosed in a patent document JP-A-2009-268054. In this technique, a drive signal inputted to the gate of an RC-IGBT is prevented from passing therethrough in a period in which current is determined to pass through a free-while diode in a forward direction to thereby turn off the RC-IGBT (this control is hereinafter referred to as current feedback control). The current feedback control is able to prevent the increase of voltage drop in the free-wheel diode and, further, prevent the acceleration of power loss in the free-wheel diode.

Another technique related to driving of an. IGBT is also well known as disclosed in a patent document JP-B-3339311. In this technique, the rate of charge/discharge of gate charge with respect to an IGBT is changed sometime in a period from when the charge/discharge of gate charge is started until when it is completed (this control is hereinafter referred to as active gate control (AGC)). The following is a specific description of this technique, taking as an example a charge process of a switching element. Specifically, a switching element has a gate to which a pair of charging paths is connected. The two charging paths are provided with respective resistors having a resistance different from each other. Each of the charging paths has a transistor that opens/closes the charging path.

With this configuration, a turn-on command is inputted to the switching element to turn on the transistor in a path that includes the higher-resistance resistor. Thus, gate charges are charged at a low charge rate. After that, the above transistor is turned off, followed by turning on the other transistor in the other path that includes the lower-resistance resistor to increase (change) the charge rate. Thus, gate charges are charged at a high charge rate.

According to the techniques set forth above, the increase of surge voltage is suppressed, which is caused in bringing the switching element into an on state from an off state, or vice versa. In addition, the techniques can contribute to reducing switching loss.

Here, an idea of applying the active gate control to an RC-IGBT is considered. In a drive unit of an RC-IGBT, which can perform the active gate control, a transistor used for charging gate charges may be erroneously turned on for some reason, for example, to erroneously perform the active gate control. When the active gate control is erroneously performed, the RC-IGBT may be erroneously turned on. If the period in which the RC-IGBT is erroneously turned on coincides with the period of performing the current feedback control, power loss in the free-wheel diode is accelerated, which may lead to the increase of the amount of heat generated by the RC-IGBT.

SUMMARY

It is thus desired to provide a drive unit for a reverse-conducting switching element, the drive unit being able to favorably prevent the active gate control from being performed in a period in which current feedback control is performed.

According to an exemplary aspect of the present disclosure, there is provided a drive unit for a reverse-conducting switching element which is a driven switching element, the reverse-conducting switching element being connected to an inductor and being configured by a voltage-controlled switching element and a free-wheel diode which are mounted on a single chip, the free-wheel diode being connected in anti-parallel to the voltage-controlled switching element, the drive unit comprising: a drive control means for turning on and off the driven switching element by performing a process to transfer electric charges to a conductive control terminal of the driven switching element on the basis of a turn-on command or a turn-off command; an active gate control means for changing a transfer rate of the electric charges in a period from when the transfer of the electric charges to the conductive control terminal is started until when it is completed; a judging means for judging whether or not forward current flows in the free-wheel diode; an inhibiting means for inhibiting the electric charges from being charged to the conduction control terminal which corresponds to the free-wheel diode in which the forward current is judged to flow, while the judging means judges that the forward current flows in the free-wheel diode; and a disabling means for disabling the active gate control means for changing the transfer rate of the electric charges, while the inhibiting means inhibits the electric charges from being charged to the conduction control terminal.

As mentioned above, the exemplary embodiment set forth above includes the disabling means. With this configuration, the transfer rate of electric charges is prevented from being erroneously changed by the active gate control means in a period in which the inhibiting means inhibits electric charges from being charged to the conduction control terminal. Accordingly, the driven switching element is prevented from being turned on. Thus, power loss in the free-wheel diode will not be accelerated.

BRIEF DESCRIPTION OF THE DRAWINGS

In the accompanying drawings:

FIG. 3 is a timing chart illustrating an outline of a discharge process according to the first exemplary embodiment;

FIG. 7 is a timing chart illustrating an example of the current feedback control;

FIG. 8 is a flow diagram illustrating a disabling process according to the first exemplary embodiment;

DESCRIPTION OF EMBODIMENTS

Hereinafter, exemplary embodiments of the present invention are described with reference to the accompanying drawings.

(First Exemplary Embodiment)

Referring to FIGS. 1 to 9, a first exemplary embodiment of the present invention is described. In the first exemplary embodiment, a drive unit for a switching element according to the present invention is applied to a vehicle that installs a rotary machine as an on-vehicle propulsion machine.

Figure 1:
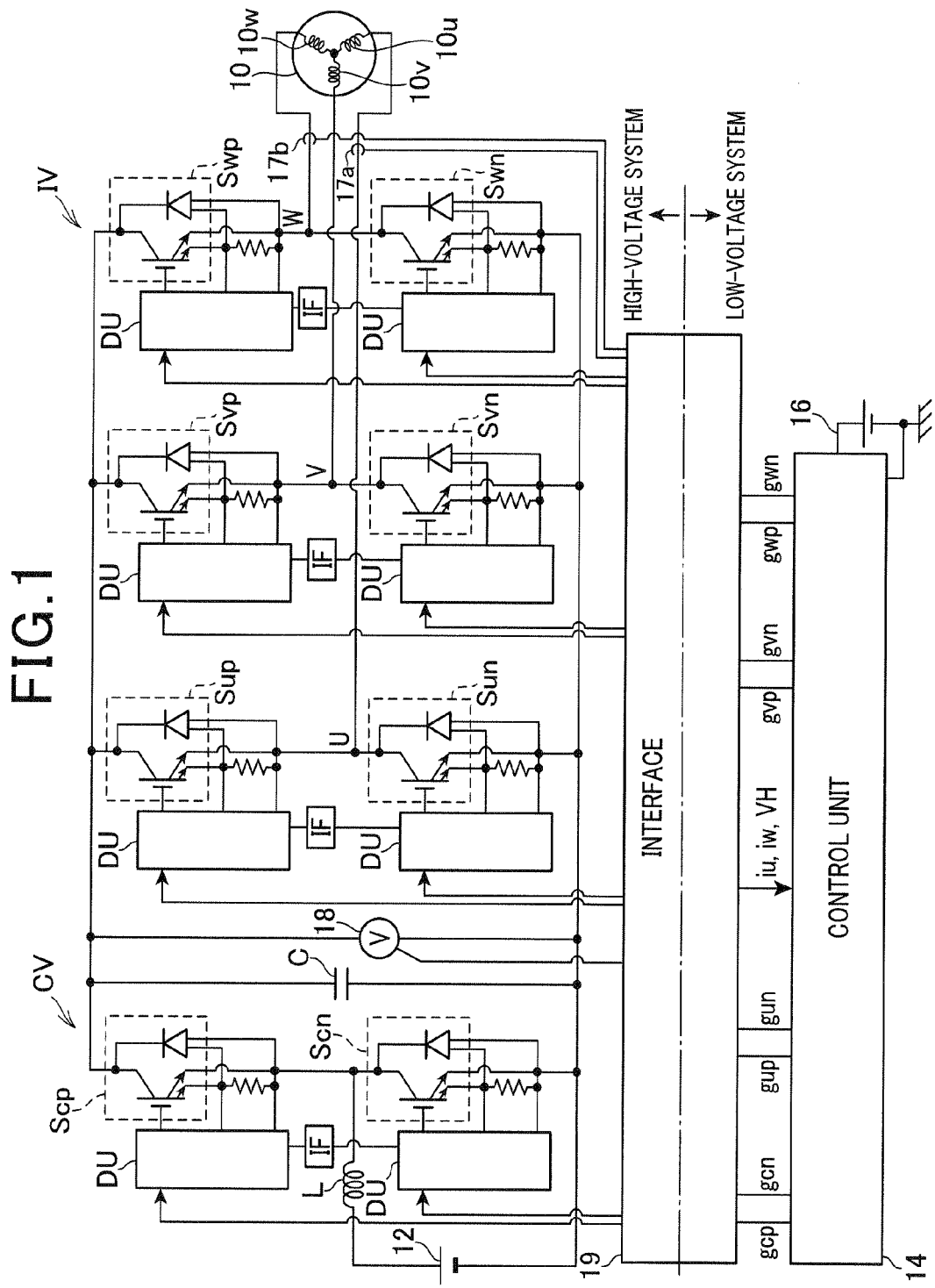
FIG. 1 is a diagram illustrating a configuration of a system including a drive unit according to a first exemplary embodiment.

FIG. 1 is a diagram illustrating a system including a drive unit according to the first exemplary embodiment.

As shown in FIG. 1, the system includes a motor-generator 10 that is a three-phase rotary machine as an on-vehicle propulsion machine. The motor-generator 10 is a permanent magnet synchronous motor (e.g., SPMSM (surface permanent magnet synchronous motor) or IPMSM (interior permanent magnet synchronous motor)). The motor-generator 10 includes a stator and a rotor. The stator has a U-phase coil 10$u$, a V-phase coil 10$v$ and a W-phase coil 10$w$. The rotor, not shown, includes permanent magnets and is mechanically connected to drive wheels. The coils 10$u$, 10$v$ and 10$w$ have respective ends which are mutually connected at a neutral point to form a Y connection. The system also includes an inverter IV, a converter CV, a high-voltage battery 12, a control unit 14, a low-voltage battery 16 and an interface 19.

The motor-generator 10 is connected to the high-voltage battery 12 via the inverter IV as a DC-AC converter circuit and the converter CV as a DC power supply. The converter CV includes a capacitor C, a pair of switching elements Scp and Scn, and a reactor L. The two switching elements Scp and Scn, which are serially connected to each other via a connecting point therebetween, are connected in parallel with the capacitor C. The reactor L connects the connecting point of the two switching elements Scp and Scn to the positive pole of the high-voltage battery 12.

On the other hand, the inverter IV includes a serial connection of switching elements Sup and Sun, a serial connection of switching elements Svp and Svn and a serial connection of switching elements Swp and Swn. These three serial connections have respective connecting points which are connected to respective ends of the U-, V- and W-phase coils 10$u$, 10$v$ and 10$w$.

In the present exemplary embodiment, a reverse-conducting insulated gate bipolar transistor (RC-IGBT) incorporating a diode is used as a switching element S*# (*=c, u, v or w; and #=p or n). Each switching element S*# as an RC-IGBT is configured by a voltage-controlled switching element and a free-wheel diode, which are in anti-parallel connection and mounted on a single chip (see FIG. 1). The voltage-controlled switching element is configured by a main switching element Sm*# and a sense switching element St*# (see FIG. 2). The free-wheel diode is configured by a main diode Dm*# and a sense diode Dt*# (see FIG. 2). More details of the switching element S*# will be given later.

The control unit 14 uses the low-voltage battery 16 as a power supply and acquires detection values such as from current sensors 17$a$ and 17$b$ and voltage sensor 18 to desirably control a controlled variable (e.g., torque) of the motor-generator 10. The current sensors 17$a$ and 17$b$ detect currents iu and iw of phases U and W, respectively, of the motor-generator 10. The voltage sensor 18 detects an input voltage VH of the inverter IV (voltage of the capacitor C). The control unit 14 generates manipulated signals gcp and gcn on the basis such as of the detection values derived from the various sensors. The control unit 14 outputs these signals to the drive unit DU to thereby drive the respective switching elements Scp and Scn of the converter CV. The control unit 14 also generates manipulated signals gup, gun, gyp, gvn, gwp and gwn under well-known sine-wave PWM (pulse width modulation) control, for example, on the basis such as of the detection values derived from the various sensors. The control unit 14 outputs these signals to the corresponding drive units DUs to thereby drive the respective switching elements Sup, Sun, Svp, Svn, Swp and Swn of the inverter IV.

The manipulated signal g*p outputted to the high-potential-side switching element S*p stands in complementary relation to the manipulated signal g*n outputted to the low-potential-side switching element S*n. Specifically, when the manipulated signal g*p is a turn-on command, the manipulated signal g*n is a turn-off command. Contrarily, when the manipulated signal g*p is a turn-off command, the manipulated signal g*n is a turn-on command. In the system shown in FIG. 1, a dead time interval is set when the manipulated signal g*# is switched from a turn-on command to a turn-off command, or vice versa.

From a viewpoint of voltage, the system of the present exemplary embodiment is comprised of a high-voltage system that includes the high-voltage battery 12, and a low-voltage system that includes the low-voltage battery 16. The high- and low-voltage systems are insulated from each other. Signal transmission/reception between the high- and low-voltage systems is conducted via the interface 19, such as a photocoupler, which includes an insulating element.

In the three serial connections of the switching elements S*#, the drive units of the high-potential-side switching elements S*p are ensured to communicate with the drive units of the low-potential-side switching elements S*n via respective interfaces IF each having an insulating element as mentioned above.

Figure 2:
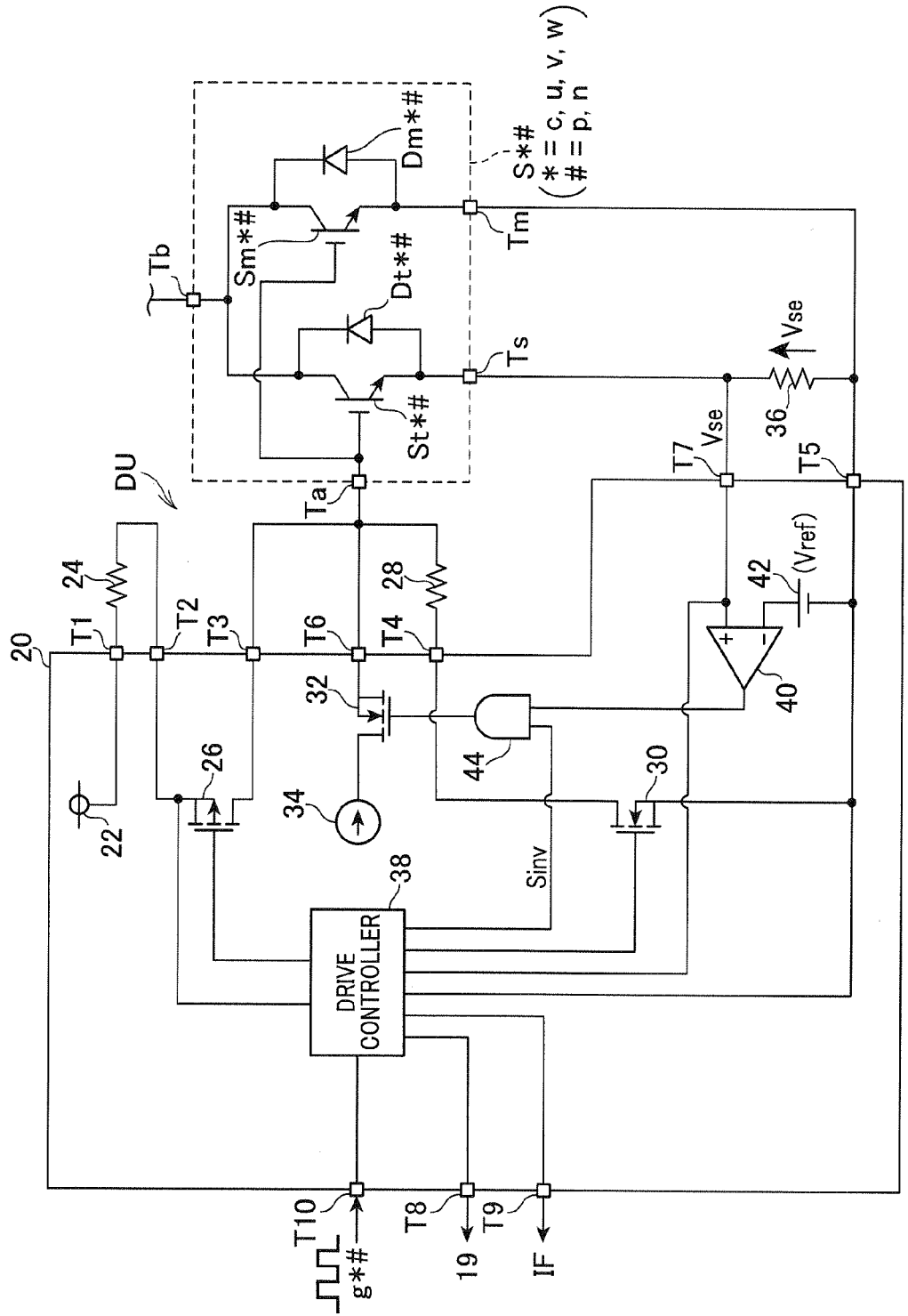
FIG. 2 is a schematic diagram illustrating a drive unit according to the first exemplary embodiment.

Referring now to FIG. 2, hereinafter is described how the drive units DU are each configured in the present exemplary embodiment.

FIG. 2 is a schematic diagram illustrating one of the drive units DU in the system. As shown in FIG. 2, the drive unit DU includes a drive IC (integrated circuit) 20 and a constant-voltage power supply 22. The drive IC 20 is a semiconductor integrated circuit mounted on a single chip. The constant-voltage power supply 22 applies voltage to a conduction control terminal (gate) of the switching element S*# as an RC-IGBT. The constant-voltage power supply 22 is connected to a terminal T2 of the drive IC 20 via a terminal T1 of the drive IC 20 and a constant-current resistor 24. The terminal T2 is connected to a terminal Ta of the switching element S*# via a P-channel MOSFET (metal-oxide semiconductor field-effect transistor) (charging switching element 26) and a terminal T3 of the drive IC 20. The terminal Ta is connected to the gate of the switching element S*# (that includes the main switching element Sm*# and the sense switching element St*#, which configure a voltage-controlled switching element).

The terminal Ta is also connected to a terminal T4 of the drive IC 20 via a discharging resistor 28. The terminal T4 is connected to a terminal T5 of the drive IC 20 via an N-channel MOSFET (discharging switching element 30). The terminal Ta of the switching element S*# is connected to a constant-current source 34 via a terminal T6 of the drive IC 20 and an N-channel MOSFET (AGC (active gate control) switching element 32).

As mentioned above, the switching element S*# is formed on a single chip, being provided with the voltage-controlled switching element which is configured by the main switching element Sm*# and the sense switching element St*#, and the free-wheel diode which is configured by the main diode Dm*# and the sense diode Dt*#. Specifically, the main switching element Sm*# is connected in anti-parallel to the main diode Dm*#. Also, the sense switching element St*# is connected in anti-parallel to the sense diode Dt*#.

The main switching element Sm*# and the sense switching element St*# have a main collector and a sub-collector, respectively, as input terminals. The main collector and the sub-collector are connected to a terminal Tb of the switching element S*#. The main switching element Sm*# and the sense switching element St*# have a main emitter and a sub-emitter, respectively, as output terminals. The main emitter is connected to a main terminal Tm, while the sub-emitter is connected to a sense terminal Ts.

The main terminal Tm is connected to the terminal T5. The sense terminal Ts is connected to the terminal T5 via a resistor (hereinafter referred to as a sense resistor 36). One of the ends of the sense resistor 36, which is on a sense terminal Ts side, is connected to a drive controller 38 and a non-inverting input terminal of a comparator 40 via a terminal T7 of the drive IC 20. The comparator 40 has an inverting input terminal connected with a power supply 42 that has a reference voltage Vref. In the present exemplary embodiment, a potential difference between the ends of the sense resistor 36 is hereinafter referred to as a sense voltage Vse. The sense voltage Vse is defined to be positive when the end of the sense resistor 36 on the sense terminal Ts side has a potential higher than the potential of the main emitter (main terminal Tm).

With this configuration, when current flows between the main collector and the main emitter (hereinafter this current is referred to as collector current), very small current is outputted from the sense switching element St*#. This small current is in a positive correlation with the collector current. Thus, current flows from the sense terminal Ts to the sense resistor 36 to cause a voltage drop in the sense resistor 36 and allow the sense voltage Vse to have a positive value.

On the other hand, when forward current flows through the main diode Dm*# (i.e. when current flows from the anode to the cathode of the main diode Dm*#), small current flows from the sense resistor 36 toward the anode of the sense diode Dt*# via the sense terminal Ts. This small current is in a positive correlation with the forward current that flows through the main diode Dm*#. Thus, a voltage drop is caused in the sense resistor 36 to allow the sense voltage Vse to have a negative value.

An output signal of the comparator 40 and a disabling signal Sinv, which will be described later, outputted from the drive controller 38 are inputted to an AND circuit 44. An output signal of the AND circuit 44 is inputted to the gate of the AGC switching element 32. The disabling signal Sinv has a high logic level in a period in which a disabling process, which will be described later, is not performed.

The drive unit DU includes a terminal T8 which is used for transmitting information in the drive controller 38 to the control unit 14 via the interface 19. The drive unit DU also includes a terminal T9 which is used for transmitting, via the interface IF, information in the drive controller 38 from the high-potential-side switching element S*p to the low-potential-side switching element S*n, or vice versa, which are connected in series. In other words, the terminal T9 is used for transmitting the information toward an opposed arm via the interface IF.

Hereinafter is described a process of charging/discharging the gate of the switching element S*#. This process is conducted by the drive controller 38.

First, a process of charging the gate (hereinafter referred to as a gate-charge process) is described.

The gate-charge process is performed by receiving a manipulated signal g*# as a turn-on command from the control unit 14 via a terminal T10 of the drive IC 20. In the present exemplary embodiment, the gate-charge process is performed under constant-current control. Under the constant-current control, the gate voltage of the charging switching element 26 is controlled to achieve a target voltage drop (e.g., 1 V) in the constant-current resistor 24. Thus, the charging current at the gate of the switching element S*# is controlled to have a fixed value. This suppresses the surge voltage generated when the switching element S*# is turned on.

Secondly, a process of discharging the gate (hereinafter referred to as a gate-discharge process) is described.

In the present exemplary embodiment, the active gate control is performed as the gate-discharge process to change the speed of discharging gate charges (herein after referred to as discharge rate) in the switching element S*#. The active gate control is performed sometime in a period from when discharge of the gate charges is started until when it is completed. Referring to FIG. 3, the active gate control of the present exemplary embodiment is described.

FIG. 3 shows an example of the gate-discharge process of the present exemplary embodiment. In FIG. 3: (a) shows transition of the manipulated signal g*#; (b) shows transition of gate voltage Vge; (c) shows transition of voltage across the main collector and the main emitter (hereinafter referred to as inter-collector-emitter voltage Vce) and transition of collector current Ic; (d) shows transition of sense voltage Vse; (e) shows transition of the operating state of the discharging switching element 30; and (f) shows transition of the operating state of the AGC switching element 32.

In the example shown in FIG. 3, the charging switching element 26 is turned off and the discharging switching element 30 is turned on at time t1 when the manipulated signal g*# is switched from a turn-on command to a turn-off command. Thus, discharge of the gate charges is started and the gate voltage Vge begins to decrease.

After that, the inter-collector-emitter voltage Vce begins to increase, while the collector current Ic begins to decrease. At time t2 when the sense voltage Vse exceeds the reference voltage Vref, the output signal of the comparator 40 is permitted to have a high logic level. Accordingly, the AGC switching element 32 is turned on to allow current to flow from the constant-current source 34 toward the discharging resistor 28, thereby lowering the level of the current that flows from the gate toward the discharging resistor 28. Thus, the gate charges are prevented from being discharged and the discharge rate of the gate charges is changed from high to low.

After that, the output signal of the comparator 40 is switched to a low logic level at time t3 when the sense voltage Vse falls below the reference voltage Vref. Thus, the AGC switching element 32 is turned off.

In the present exemplary embodiment, the sense voltage Vse is used to detect the timing of changing the discharge rate. This is because, while suppressing the surge voltage in switching the switching element from an on state to an off state, use of the sense voltage Vse can correlate the timing of changing the discharge rate that can reduce the switching loss, with the timing for the sense voltage Vse to pass from below to above the reference voltage Vref. There is a tendency that as the period becomes shorter from when the manipulated signal is switched to a turn-off command until when the discharge rate is changed, the effect of reducing surge voltage becomes larger while the effect of reducing switching loss becomes smaller.

As indicated in the vicinity of time t2 in (d) of FIG. 3, the sense voltage Vse drastically increases when the switching element S*# is switched from an on state to an off state (this phenomenon is hereinafter referred to as a lifting phenomenon). It is considered that this phenomenon is caused when the surge voltage is superimposed on the sense voltage Vse via parasitic capacitance, for example, across the main collector or the main emitter and the gate of the switching element S*#.

Hereinafter is described current feedback control according to the present exemplary embodiment, which is performed by the drive controller 38.

Figure 4A:
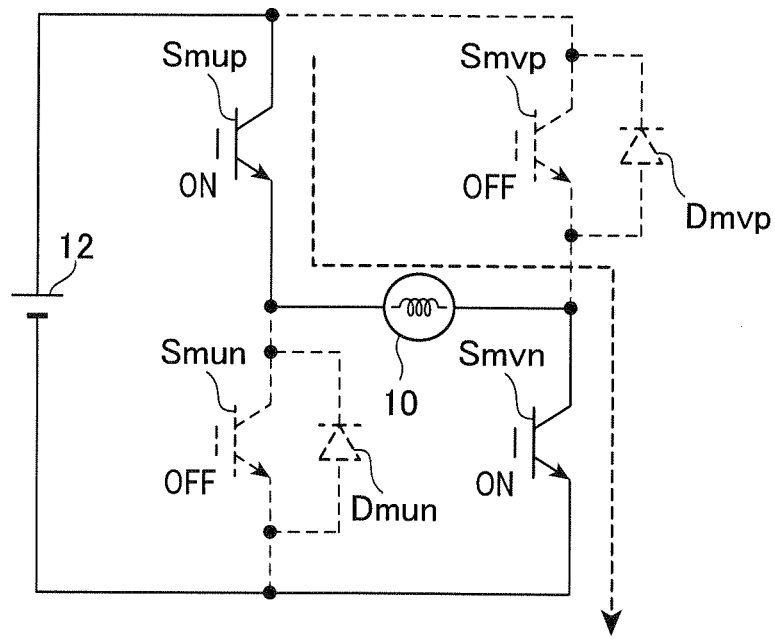
FIGS. 4A and 4B are diagrams illustrating models of forward current flow in a free-wheel diode.
Figure 4B:
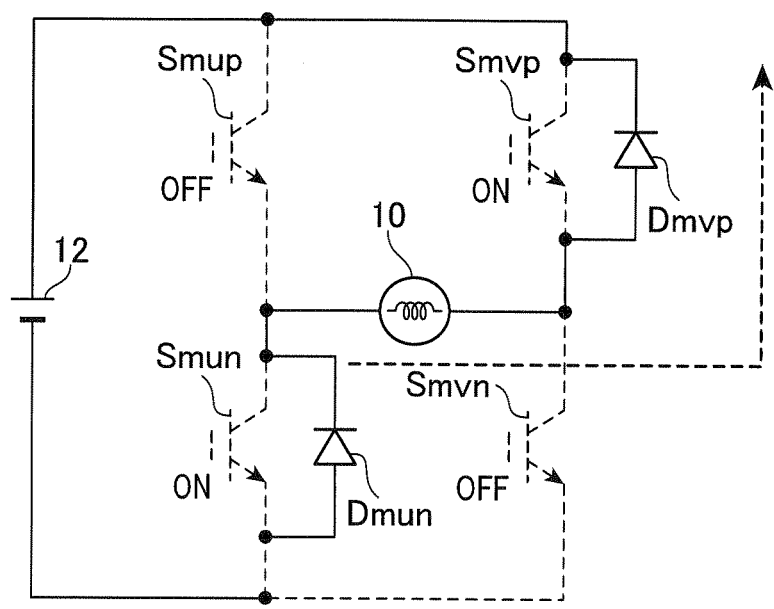

The current feedback control is performed in a period in which forward current is determined to pass through a main diode D*#. Under the current feedback control, charge of the gate charges is inhibited in the switching element S*# which is mounted on a chip that also mounts thereon the main diode Dm*# in question through which forward current is determined to pass. The current feedback control is performed to prevent the increase of power loss in the main diode Dm*#. Referring to FIGS. 4A and 4B as well as FIG. 5, a mechanism that accelerates power loss is explained. After that, referring to FIGS. 6 and 7, details of the current feedback control are described.

FIGS. 4A and 4B each show the phases U and V of the inverter IV of the system configuration shown in FIG. 1. Specifically, FIGS. 4A and 4B each show a part of the circuit, which includes the upper and lower arms (main switching elements Smup, Smun, Smvp and Smvn, and main diodes Dmup, Dmun, Dmvp and Dmvn) of the phases U and V of the inverter IV, the high-voltage battery 12 and the motor-generator 10.

Usually, when sine-wave current is passed through the motor-generator 10, the high-potential-side main switching element Smup and the low-potential-side main switching element Smun are complementarily driven according to the manipulated signals gup and gun, respectively. Also, the high-potential-side main switching element Smvp and the low-potential-side main switching element Smvn are complementarily driven according to the manipulated signals gvp and gvn, respectively. As shown in FIG. 4A, let us assume that: the high-potential-side main switching element Smup and the low-potential-side main switching element Smvn are turned on; the high-potential-side main switching element Smvp and the low-potential-side main switching element Smun are turned off; and current flows from the main switching element Smup to the main switching element Smvn via coils (serial connection of the U-phase coil 10u and the V-phase coil 10v) of the motor-generator 10.

Following the situation set forth above, let us assume that, as shown in FIG. 4B, that: the main switching elements Smup and Smvn are turned off; and the main switching elements Smvp and Smun are turned on. In such a case, induction current of the coils of the motor-generator 10 continuously flows through the main diode Dmvp, before current flows from the high-voltage battery 12 toward the main switching element Smun, via the main switching element Smvp and the coils of the motor-generator 10.

Figure 5:
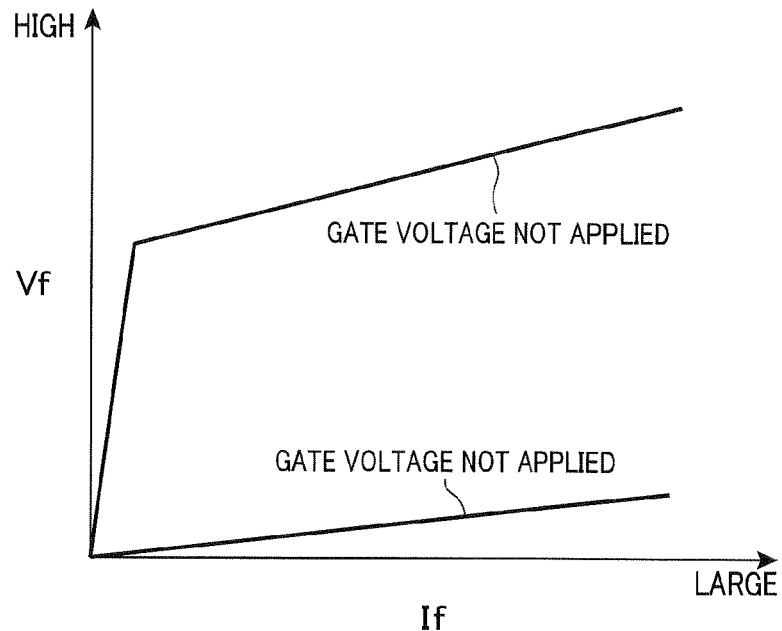
FIG. 5 is a diagram illustrating a relationship between forward current and voltage drop in a free-wheel diode in the cases where gate voltage is applied and not applied.

As shown in FIG. 5, under the conditions where a forward current If flows through a main diode Dm*# and a voltage is applied to the gate of the switching element S*#, a voltage drop Vf is large in the main diode Dm*# compared to the case where no voltage is applied. The large voltage drop Vf allows acceleration of power loss in the free-wheel diode. For this reason, in FIG. 4B, power loss is accelerated in the main diode Dmvp. The current feedback control is performed to prevent such a problem.

The acceleration of power loss is explained above, taking as an example the switching elements included in the inverter IV shown in FIGS. 4A and 4B. However, the problem of accelerating power loss as described above can also be caused in the switching elements included in the converter CV. In this case, the induction current of the reactor L in the converter CV corresponds to the forward current passing through the free-wheel diode.

Figure 6:
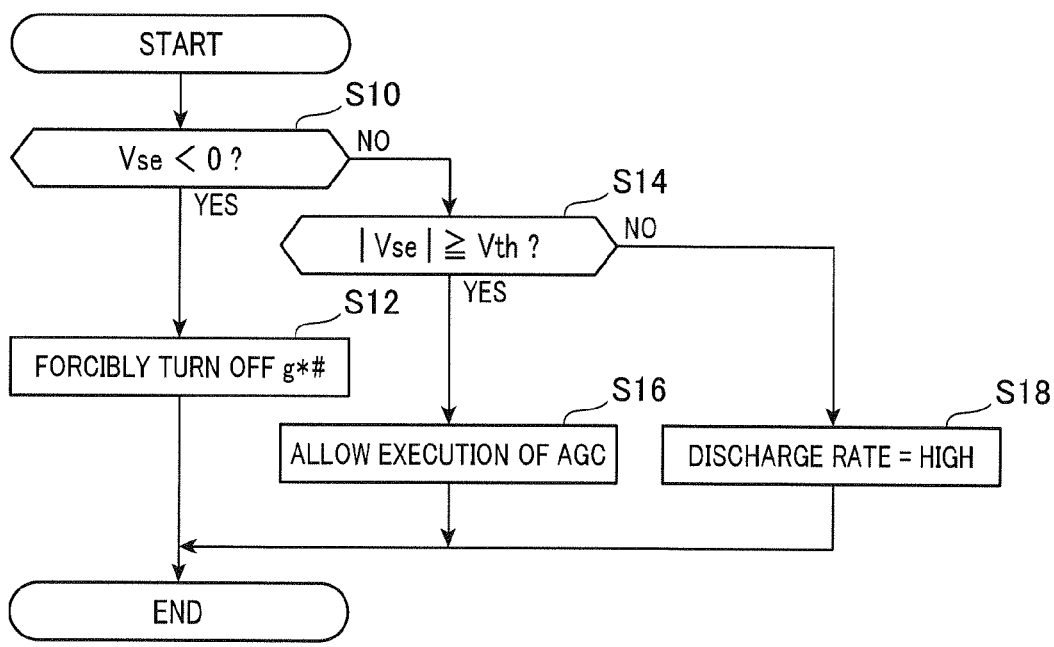
FIG. 6 is a flow chart illustrating current feedback control according to the first exemplary embodiment.

Referring now to FIG. 6, details of the current feedback control are described. FIG. 6 is a flow diagram illustrating a series of steps of the current feedback control which is performed by the drive controller 38. Since the drive controller 38 of the present exemplary embodiment is a hardware processing means, the process shown in FIG. 6 is actually performed by a logic circuit.

At step S10 in the series of steps, it is determined whether or not the sense voltage Vse has a negative value. This step is performed to determine whether or not forward current flows through the main diode Dm*#.

If an affirmative determination is made at step S10, control proceeds to step S12. At step S12, as the current feedback control, a manipulated signal g*# received via the terminal T10 is forcibly changed to a turn-off command. As a result of the forcible change, gate charges are inhibited from being charged.

On the other hand, if a negative determination is made at step S10, control proceeds to step S14. At step S14, it is determined whether or not the absolute value of the sense voltage Vse is equal to or larger than a threshold voltage Vth (>0). This step is performed to determine whether or not the active gate control should be performed when the gate-discharge process is performed next time. The threshold voltage Vth may be set from a viewpoint of not impairing the reliability of the switching element S*# by performing step S18 described later.

If an affirmative determination is made at step S14, control proceeds to step S16 at which the active gate control is permitted to be performed when the gate-discharge process is performed next time.

On the other hand, if a negative determination is made at step S14, control proceeds to step S18. At step S18, the drive controller 38 gives an instruction not to perform the active gate control when the gate-discharge process is performed next time, but perform the gate-discharge process at a high discharge rate. This step is performed to suppress the increase of switching loss.

In other words, a smaller absolute value of the sense voltage Vse at step S14 can make smaller the collector current accordingly. In such a situation, the rate of decrease of the collector current is decelerated when the switching element S*# is switched from an on state to an off state. When the rate of decrease of the collector current is low, the surge voltage generated in switching the switching element to an off state decreases. In other words, a large margin is ensured between the actual inter-collector-emitter voltage of the switching element S*# and its allowable upper limit. In this situation, when the gate-discharge process is performed in a state where a high discharge rate is maintained, it may be difficult to necessarily obtain the effect of decreasing the surge voltage when the switching element S*# is switched to an off state. Nevertheless, the inter-collector-emitter voltage is considered not to become excessively high in this situation.

When the processing at step S12, S16 or S18 is completed, the series of steps is temporarily ended.

FIG. 7 shows an example of the current feedback control under the conditions where current flows from the U-phase arm to the V-phase arm via the coils of the motor-generator 10. In FIG. 7; (a) shows transition of current that passes through the V-phase coil 10v; (b) shows transition of the manipulated signal gyp inputted to the drive unit DU of the upper V-phase arm; (c) shows transition of the manipulated signal gvn inputted to the drive unit DU of the lower V-phase arm; (d) shows transition of a forward current flow in the main diode Dmvp of the upper V-phase arm; and (e) shows transition of a collector current flow in the main switching element Smvn of the lower V-phase arm. In (a) of FIG. 7, the current that flows from the U-phase arm toward the V-phase arm via the coils of the motor-generator 10 is defined to be positive. In (b) and (c) of FIG. 7, indication of the dead time interval is omitted.

As indicated by the broken line in (b) of FIG. 7, the manipulated signal gyp of the upper V-phase arm is switched, at time t1, from a turn-off command to a turn-on command. At the same time, as shown in (c) of FIG. 7, the manipulated signal gvn of the lower V-phase arm is switched, at time t1, from a turn-on command to a turn-off command. With the switch of the manipulated signal gvn of the lower V-phase arm to a turn-off command, the collector current flowing through the main switching element Smvn is stopped and forward current begins to flow through the main diode Dmvp. Thus, in the period between time t1 and time t2, the drive controller 38 determines that forward current flows through the main diode Dmvp (makes an affirmative determination at step S10 of FIG. 6) and carries out the current feedback control. Accordingly, as indicated by the solid line in (a) of FIG. 7, the manipulated signal gyp of the upper V-phase arm is forcibly changed to a turn-off command.

The current feedback control is similarly carried out in the period between time t3 and time t4 to forcibly change the manipulated signal gyp to a turn-off command.

For example, there may be a probability that noise enters an electric path connected to the non-inverting input terminal of the comparator 40. Due to such an entry of noise, the output signal of the AND circuit 44 may erroneously have a high logic level to erroneously turn on the AGC switching element 32. If the AGC switching element 32 is erroneously turned on in the period in which the current feedback control is performed, the gate of the switching element S*# is charged by the constant-current source 34. As a result, the switching element S*# may be erroneously turned on. In this case, voltage drop in the free-wheel diode D*# may increase, leading to the acceleration of power loss in the free-wheel diode D*#. As a result, the heat generated by the switching element S*# may increase and thus the reliability of the switching element S*# may be impaired.

As a measure against such a problem, the disabling process mentioned above is performed in the present exemplary embodiment in the period in which the current feedback control is performed. The disabling process is performed such that the disabling signal Sinv will have a low logic level. The disabling signal Sinv is outputted from the drive controller 38 to the AND circuit 44, the drive controller 38 being included in the drive unit DU that performs the current feedback control. Thus, the AGC switching element 32 is inhibited from being turned on in the period in which the current feedback control is performed. In this way, the reliability of the switching element S*# is prevented from being impaired.

FIG. 8 is a flow diagram illustrating a series of steps of the disabling process according to the present exemplary embodiment. The disabling process is performed by the drive controller 38. The disabling process shown in FIG. 8 is actually performed by a logic circuit.

At step S20 in the series of steps, the drive controller 38 determines whether or not the current feedback control is being performed.

If an affirmative determination is made at step S20, control proceeds to step S22. At step S22, the disabling process is performed to impart a low logic level to the disabling signal Sinv.

If a negative determination is made at step S20, control proceeds to step S24 at which the drive controller 38 imparts a high logic level to the disabling signal Sinv.

When step S22 or S24 is completed, the series of steps is temporarily ended.

Figure 9:
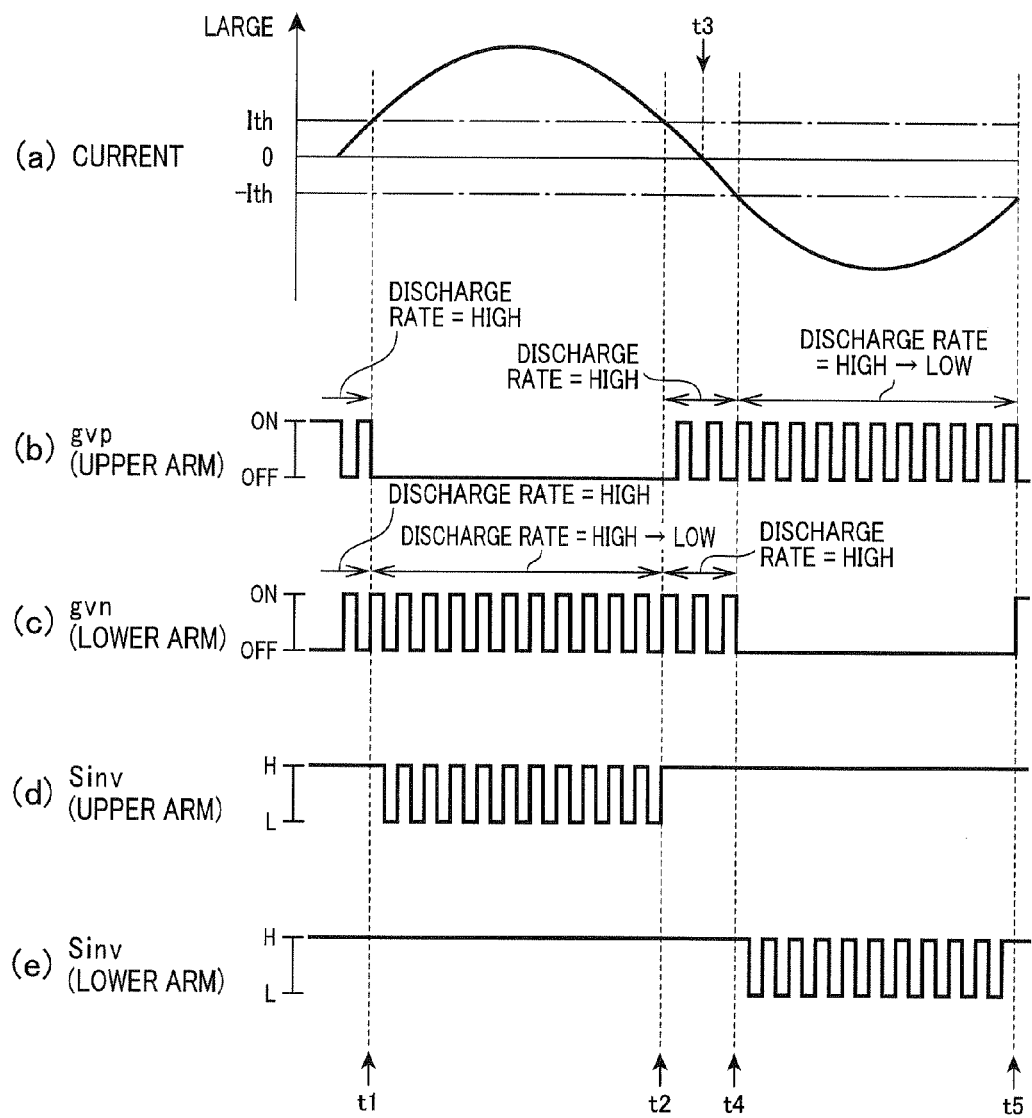
FIG. 9 is a timing chart illustrating an example of the disabling process.

FIG. 9 show an example of the disabling process conducted with respect to the V-phase arm. In FIG. 9, (a) to (c) correspond to (a) to (c) of FIG. 7, respectively. In FIG. 9; (d) shows transition of the disabling signal Sinv for the upper V-phase arm; and (e) shows transition of the disabling signal Sinv for the lower V-phase arm. In (a) of FIG. 9, a reference current Ith (>0) indicates the forward current when the absolute value of the sense voltage Vse becomes equal to the threshold voltage Vth.

In the example shown in FIG. 9, the period between time t1 and time t3 corresponds to a situation where current flows from the U-phase arm to the V-phase arm via the motor-generator 10, or a situation where current flows from the U- or V-phase arm to the W-phase arm via the motor-generator 10. Specifically, in the period between time t1 and time t2, the current feedback control is performed with respect to the upper V-phase arm. The period between time t1 and time t2 corresponds to an interval in which the manipulated signal gyp for the upper V-phase arm is temporarily rendered to be a turn-off command. At the same time, in this period, the disabling process is performed to allow the disabling signal Sinv to have a low logic level.

In the period between time t1 and time t2, the drive controller 38 corresponding to the lower arm determines that the sense voltage Vse has a positive value and that the absolute value of the sense voltage Vse will become equal to or larger than the threshold voltage Vth. Therefore, the active gate control is performed in the gate-discharge process which is performed by the drive controller 38 corresponding to the lower arm. Also, the drive controller 38 determines that the absolute value of the sense voltage Vse will become smaller than the threshold voltage Vth in the period from time t2 to time t3 when the direction of the current flow changes and in the period from time t3 to time t4. Therefore, the active gate control is not performed but the gate-discharge process is performed at a high discharge rate in these periods.

After that, in the period between time t4 and time t5, the current feedback control is performed with respect to the lower V-phase arm. The period between time t4 and time t5 corresponds to an interval in which the manipulated signal gvn of the lower V-phase arm is temporarily rendered to be a turn-off command. At the same time, in this period, the disabling process is performed.

In the present exemplary embodiment, the high-potential-side switching element Svp and the low-potential-side switching element Svn are alternately turned on/off in a period between time t2 and time t4. This alternate turn-on/off operation is conducted under the conditions where the target of the current feedback control is switched from the high-potential-side switching element Svp to the low-potential-side switching element Svn, or vice versa. When the target of the current feedback control is switched, the alternate turn-on/off operation performed in the period between time t2 and time t4 can prevent an excessively long duration of an off state of both of the switching elements Svp and Svn due to the variation in the switching speed. Accordingly, owing to the alternate turn-on/off operation, controllability of the motor-generator 10 will not be impaired.

According to the first exemplary embodiment specifically described above, the following advantages are obtained.

(1) The disabling process is performed in a period in which the current feedback control is performed. In the disabling process, a low logic level is imparted to the disabling signal Sinv in the drive unit DU targeted to the current feedback control. Thus, in the period in which the current feedback control is performed, the AGC switching element 32 is prevented from being erroneously turned on. Thus, the switching element S*# is also prevented from being turned on. Accordingly, power loss in the free-wheel diode will not be increased. Further, the reliability of the switching element S*# will not be impaired.

(2) The period in which the sense voltage Vse is determined to have a negative value is determined to be a period in which forward current passes through the main diode Dm*#. Thus, the flow of forward current through the main diode Dm*# can be appropriately detected.

(3) Under the conditions where the sense voltage Vse is determined to have a positive value and the absolute value of the sense voltage Vse is determined to be smaller than the threshold voltage Vth, the active gate control is not performed in the subsequent gate-discharge process but the gate-discharge process is performed at a high discharge rate. Thus, switching speed is increased but switching loss is hardly increased.

(Second Exemplary Embodiment)

Figure 10:
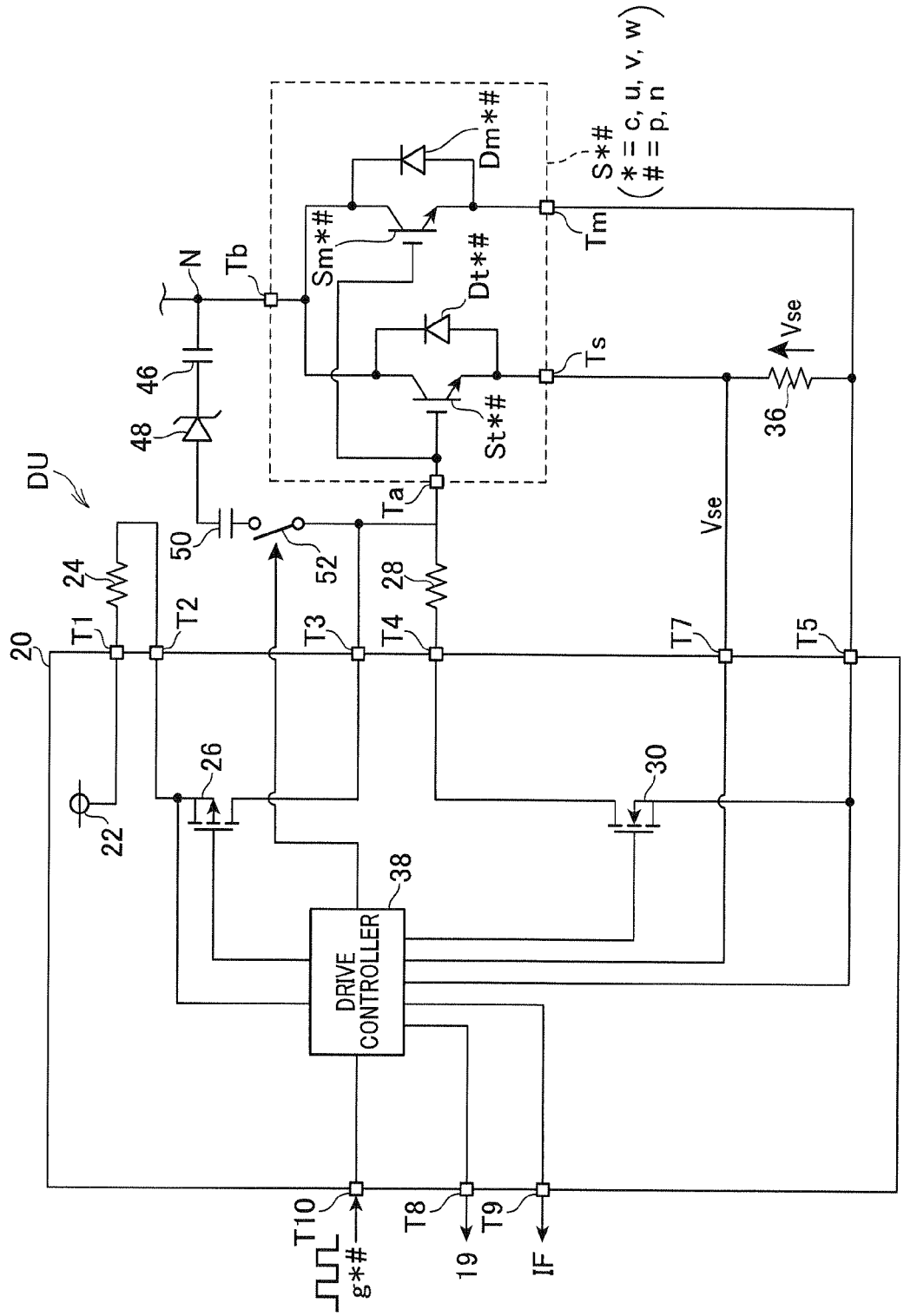
FIG. 10 is a diagram illustrating a configuration of a drive unit according to a second exemplary embodiment.

Referring to FIG. 10, hereinafter is described a second exemplary embodiment of the present invention, focusing on the differences from the first exemplary embodiment. In the second and the subsequent exemplary embodiments as well as the modifications thereof, the components identical with or similar to those in the first exemplary embodiment are given the same reference numerals for the sake of omitting unnecessary explanation.

FIG. 10 is a schematic diagram illustrating a drive unit DU according to the second exemplary embodiment.

As shown in FIG. 10, the drive unit DU includes an electric circuit connecting between the terminals Tb and Ta. The electric circuit includes a capacitor 46, a Zener diode 48, a capacitor 50 and a switch 52, which are positioned in this order from a terminal Tb side. Specifically, the Zener diode 48 has an anode connected to the capacitor 50 and a cathode connected to the capacitor 46. A point N, i.e. one of the ends of the electric circuit, on a terminal Tb side corresponds to a source of supplying electric charges.

The switch 52 is turned on/off by the drive controller 38. Also, the switch 52 is in an on state in a period other than the period in which current feedback control is performed.

Hereinafter are described a gate-discharge process according to the present exemplary embodiment and active gate control under the conditions where the gate-discharge process is performed.

The gate-discharge process of the present exemplary embodiment is performed by turning on the discharging switching element 30 in a period in which the manipulated signal g*# is determined to be a turn-off command.

Thus, as shown in FIG. 3C, the inter-collector-emitter voltage Vice begins to increase. With this voltage increase, current flows from a main collector side of the switching element S*# toward the discharging resistor 28 via the capacitor 46, the Zener diode 48 and the capacitor 50. At the same time, current that flows from the gate to the discharging resistor 28 decreases. Therefore, gate charges are prevented from being discharged and the discharge rate of the gate charges is changed from high to low.

When a breakdown voltage of the Zener diode 48 is determined, the timing of changing the discharge rate from high to low is determined. Specifically, a higher breakdown voltage tends to provide a longer interval from when the manipulated signal g*# is switched to a turn-off command until when the discharge rate is changed, and tends to make smaller the effect of reducing the surge voltage.

A disabling process according to the present exemplary embodiment is described.

In the present exemplary embodiment, a process of turning off the switch 52 is performed as the disabling process in a period in which current feedback control is performed. For example, with this disabling process, in the event noise enters, for some reason, into an electric circuit connected to a main emitter side of the switching element S*#, the noise is prevented from being transmitted to the gate via the electric circuit that includes the capacitor 46, the Zener diode 48 and the capacitor 50. Thus, the switching element S*# is prevented from being erroneously turned on.

In this way, in the present exemplary embodiment, the disabling process in the mode as set forth above can also prevent the switching element S*# from being erroneously turned on in the period in which the current feedback control is performed.

(Third Exemplary Embodiment)

Figure 11:
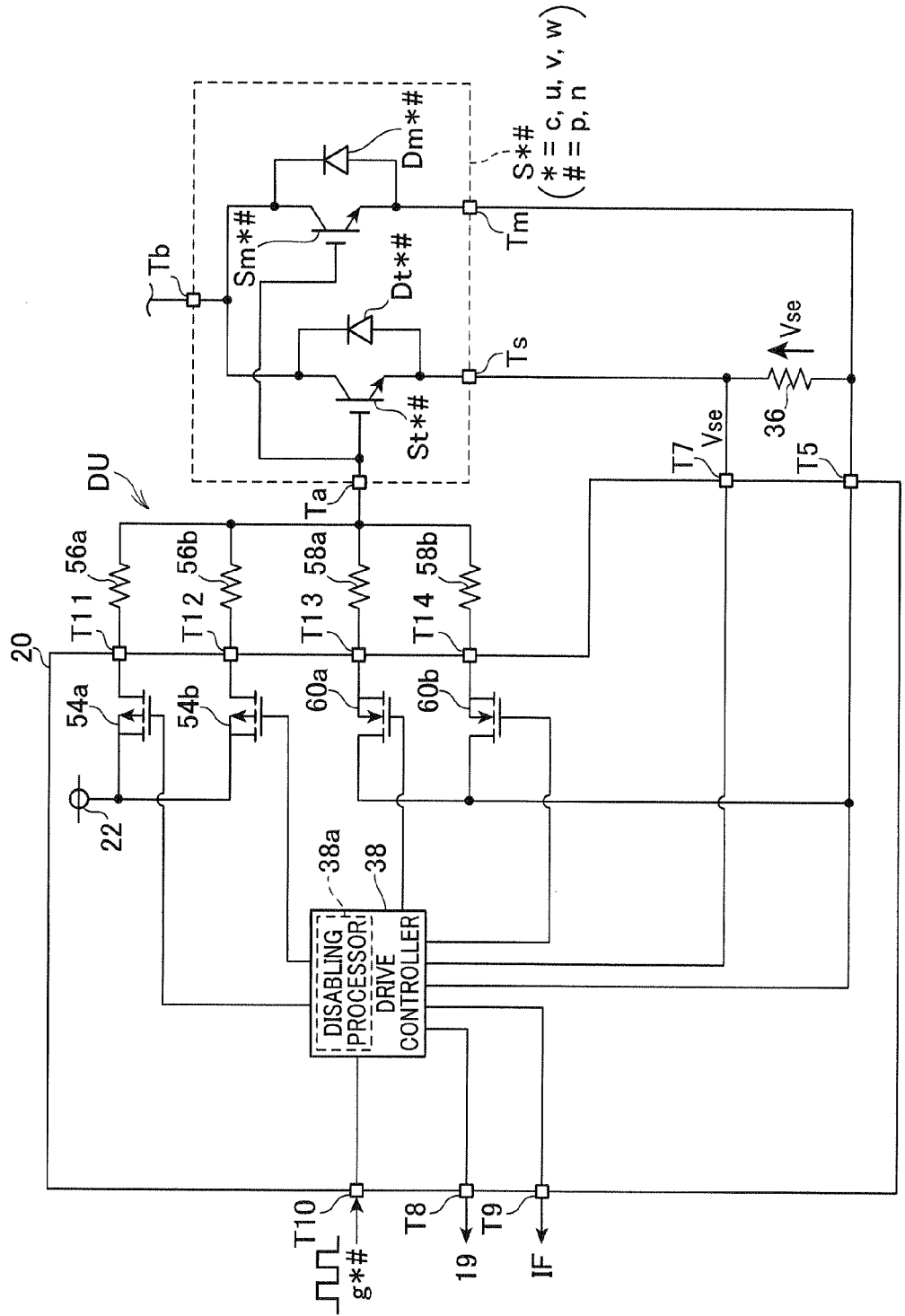
FIG. 11 is a diagram illustrating a drive unit according to a third exemplary embodiment.
Figure 12:
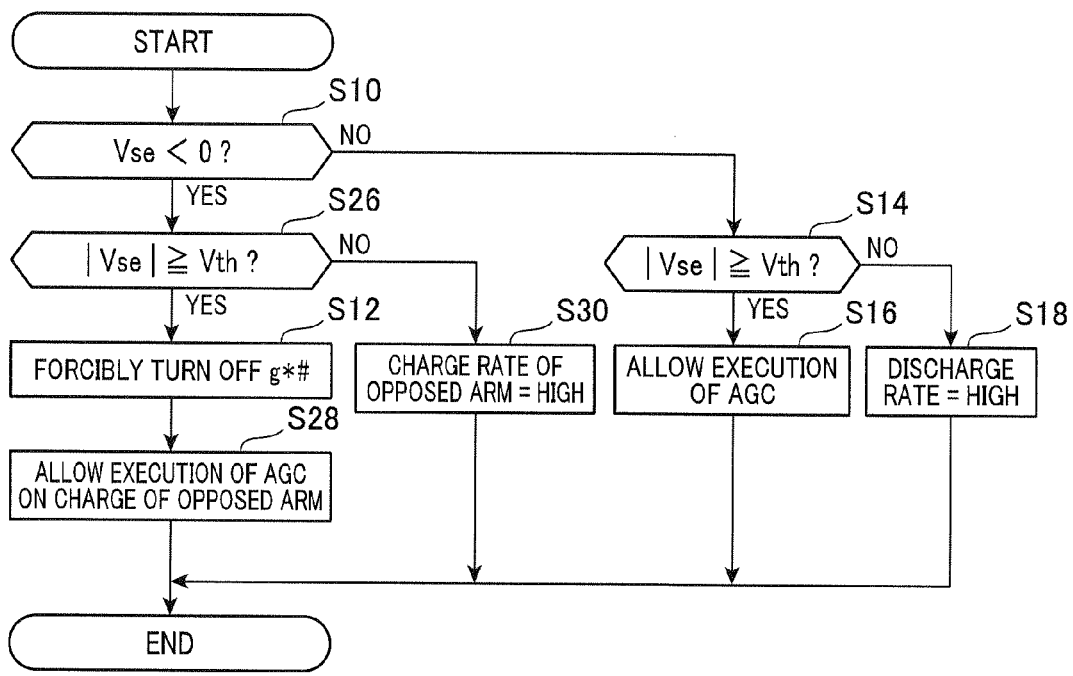
FIG. 12 is a flow chart illustrating current feedback control according to the third exemplary embodiment.

Referring to FIGS. 11 and 12, hereinafter is described a third exemplary embodiment of the present invention focusing on the differences from the first exemplary embodiment.

FIG. 11 is a schematic diagram illustrating a drive unit DU according to the third exemplary embodiment. In FIG. 11, the drive controller 38 includes a circuit (the comparator 40 and the power supply 42) and a disabling processor 38a. The circuit compares the sense voltage Vse with the reference voltage Vref. The disabling processor 38a cuts off transmission of output signals as will be specifically described later.

As shown in FIG. 11, the constant-voltage power supply 22 is connected to a terminal T11 of the drive IC 20 via a P-channel MOSFET (first charging switching element 54a). The terminal T11 is connected to the terminal Ta via a first charging resistor 56a. Further, the constant-voltage power supply 22 is connected to a terminal T12 of the drive IC 20 via a P-channel MOSFET (second charging switching element 54b). The terminal T12 is connected to the terminal Ta via a second charging resistor 56b.

The terminal Ta is connected to a terminal T13 of the drive IC 20 via a first discharging resistor 58a. The terminal T13 is connected to the terminal T5 via an N-channel MOSFET (first discharging switching element 60a). Further, the terminal Ta is connected to a terminal T14 of the drive circuit IC 20 via a second discharging resistor 58b. The terminal T14 is connected to the terminal T5 via an N-channel MOSFET (second discharging element 60b).

The resistance may be or may not be the same between the first and second charging resistors 56a and 56b. Also, the resistance may be or may not be the same between the first and second discharging resistors 58a and 58b.

Hereinafter is described a gate-charge/discharge process of the present exemplary embodiment.

First, in the gate-discharge process, the manipulated signal g*# is switched to a turn-off command to bring both of the first and second discharging switching elements 60a and 60b into an on state, thereby achieving a high discharge rate of the gate charges. Then, either of the switching elements 60a and 60b is turned off at the timing when the sense voltage Vse exceeds the reference voltage Vref, thereby achieving a low discharge rate of the gate charges. In the period in which the gate-discharge process is performed, the first and second charging switching elements 54a and 54b are turned off.

On the other hand, in the gate-charge process, the manipulated signal g*# is switched to a turn-on command to bring either of the first and second charging switching elements 54a and 54b into an on state, thereby achieving a low charge rate of the gate charges. Then, both of the switching elements 54a and 54b are turned on to thereby achieve a high charge rate of the gate charges. In the period in which the gate-charge process is performed, the first and second discharging switching elements 60a and 60b are turned off.

The timing of changing the charge rate of the gate charges (changing timing) is detected based on the sense voltage Vse. The changing timing is determined based on a correlation of a changing timing that can reduce surge voltage and switching loss, to the sense voltage Vse. The surge voltage and switching loss in this case are caused in switching the switching element S*# from an off state to an on state. There is a tendency that as the period becomes longer from the point of switching a command to a turn-on command up to the changing timing, the effect of decreasing the surge voltage becomes larger but the effect of decreasing the switching loss becomes smaller.

Referring now to FIG. 12, hereinafter is described current feedback control of the present exemplary embodiment, which is performed by the drive controller 38. FIG. 12 is a flow diagram illustrating a series of the current feedback control of the third exemplary embodiment. The control shown in FIG. 12 is actually performed by a logic circuit.

First, when an affirmative determination is made at step S10, control proceeds to step S26. At step S26, it is determined whether or not the absolute value of the sense voltage Vse is equal to or larger than the threshold voltage Vth. The process at this step is performed to determine whether or not the conditions are suitable for performing the current feedback control. Also, the process at this step is performed to determine whether or not the active gate control should be performed when the gate-charge process is performed next time in the drive unit DU of the opposed arm. In the present exemplary embodiment, a common threshold is used in determining whether or not the conditions are suitable for performing the current feedback control and in determining whether or not the active gate control should be allowed.

If an affirmative determination is made at step S26, control proceeds to step S28 via step S12. In the process performed at step S28, information is transmitted, via the interface IF, to the drive unit DU of the opposed arm. The information indicates that the active gate control is allowed when the gate-charge process is performed next time in the drive unit DU of the opposed arm. In performing the process at step S28, information regarding the sense voltage Vse is also transmitted. Thus, the active gate control can be performed in the drive controller 38 of the opposed arm in the gate-charge process based on the transmitted sense voltage Vse.

On the other hand, when a negative determination is made at step S26, control proceeds to step S30. In the process performed at step S30, an instruction is given to the drive unit DU of the opposed arm. The instruction indicates that no active gate control should be performed when the gate-charge process is performed next time in the drive unit DU of the opposed arm but the gate-charge process should be performed at a high charge rate. Similar to the process performed at step S18, this process is performed to suppress acceleration of switching loss.

Specifically, when the sense voltage Vse has a negative value, a smaller absolute value of the sense voltage Vse can make smaller the collector current that will flow through the switching element S*# of the opposed arm when it is turned on next time. Under such conditions, the rate of increase of the collector current is low when the switching element S*# is switched from an off state to an on state. Such a low rate of increase of the collector current will decrease the surge voltage which is generated in switching the switching element S*# to an on state. In other words, a large margin is ensured between the actual inter-collector-emitter voltage of the switching element S*# and its allowable upper limit. In this situation, when the gate-charge process is performed in a state where a high discharge rate is maintained, it may be difficult to necessarily obtain the effect of decreasing the surge voltage when the switching element S*# is switched to an on state. Nevertheless, the inter-collector-emitter voltage is considered not to become excessively high in this situation.

When the process at step S16, S18, S28 or S30 is completed, the series of steps is temporarily ended.

Hereinafter, a disabling process of the present exemplary embodiment is described.

In the disabling process of the present exemplary embodiment, the disabling processor 38a cuts off transmission of the signals outputted from the drive controller 38 to the gates of the first and second charging switching elements 54a and 54b in a period in which the current feedback control is performed. For example, with this disabling process, in the event noise is superimposed on the sense voltage Vse, at least one of the first and second charging switching elements 54a and 54b is prevented from being turned on in the period in which the current feedback control is performed. Accordingly, the switching element S*# is prevented from being erroneously turned on.

In this way, in the present exemplary embodiment, the disabling process in the mode as set forth above can prevent the switching element S*# from being erroneously turned on in the period in which the current feedback control is performed.

Further, in the present exemplary embodiment, when the sense voltage Vse of one of the serially connected high- and low-potential side switching elements S*p and S*n has a negative value, the information regarding the sense voltage Vse is transmitted to the opposed arm. Then, in the opposed arm, the active gate control is performed based on the transmitted sense voltage when the gate-charge process is performed. With this configuration, in starting the gate-charge process, the collector current passing through the switching element S*# can be estimated under the conditions where the switching element S*# is switched to an on state. Thus, the active gate control is appropriately performed in performing the gate-charge process. Resultantly, the effect of decreasing the surge voltage and switching loss is enhanced.

Further, in the present exemplary embodiment, based on the sense voltage Vse having a negative value, no active gate control is performed when the gate-charge process is performed next time in the opposed arm but the gate-charge process is performed at a high charge rate. Thus, favorably, the increase of switching loss is hardly allowed.

(Modifications)

The exemplary embodiments described above may be implemented in the modifications as set forth below.

In the first exemplary embodiment described above, the entity that performs the current feedback control is the drive controller 38. However, this should not impose a limitation. For example, the entity may be the control unit 14. In this case, the current feedback control may be performed based on the phase current calculated from output values of the current sensors 17a and 17b. Specifically, based on the operating state of each switching element S*# and the phase current, it is determined whether or not forward current flows through the main diode Dm*#. If forward current is determined to flow through the main diode Dm*#, the manipulated signal g*# is forcibly changed to a turn-off command in the control unit 14, the manipulated signal g*# being for the switching element S*# that corresponds to the main diode Dm*# in which forward current is determined to flow.

At step S26 of FIG. 12, instead of the absolute value of the sense voltage Vse, the absolute value of the forward current passing through the main diode Dm*# (i.e. current passing through the coils of the motor-generator 10) may be determined as to whether it is equal to or larger than the threshold current Ith. In this case, as the absolute value of the sense voltage Vse becomes larger, the absolute value of the forward current is calculated to be a larger value.

The way of detecting the timing of changing the transfer rate of the gate charges (discharge rate or charge rate) is not limited to the one exemplified in the first and third exemplary embodiments. For example, the timing of changing the transfer rate may be detected using the rate of increase of the sense voltage Vse. As a specific example, in the first exemplary embodiment, the timing of changing the transfer rate may be detected as being the timing when the rate of increase of the sense voltage Vse exceeds a specified rate after the manipulated signal has been switched to a turn-off command.

Further, the way of detecting the timing of changing the transfer rate of the gate charges (discharge rate or charge rate) is not limited to the one based on the sense voltage Vse. For example, the timing of changing the transfer rate may be detected based on the inter-collector-emitter voltage Vce. As a specific example, in the first exemplary embodiment, the timing of changing the transfer rate may be detected as being the timing when the inter-collect-emitter voltage Vce exceeds a predetermined voltage after the manipulated signal has been switched to a turn-off command.

Furthermore, for example, the way of detecting the timing of changing the transfer rate of the gate charges (discharge rate or charge rate) may be detected based on the gate voltage or the turn-off command. As a specific example, the timing of changing the transfer rate may be detected as being the timing when a specified time elapses from the timing when the gate voltage Vge begins to decrease by performing the gate-discharge process, or from the timing when a turn-off command is received (time t1 in FIG. 3). This way of detecting the timing of changing the transfer rate is usable because a time interval from when the gate voltage Vge begins to decrease until when the collector current Ic begins to decrease can be detected by conducting experiments or the like in advance.

The way of changing the discharge rate is not limited to the one exemplified in the first exemplary embodiment. In the first exemplary embodiment, the gate and the main emitter of the switching element S*# are connected to each other in the initial period of the gate-discharge process, in which the discharge rate is desired to be high. Instead of this, for example, the gate may be connected to a portion that has a potential lower than that of the main emitter and then the gate may be connected to the main emitter for the change of the discharge rate.

In the first exemplary embodiment, the converter CV may be eliminated from between the high-voltage battery 12 and the inverter IV. In this case, the high-voltage battery 12 serves as a DC power supply.

Each of the exemplary embodiments described above uses a circuit configuration in which the sense terminal Ts is connected to the main emitter of the switching element S*# via the sense resistor 36. For example, instead of being connected to the main emitter, the sense terminal Ts may be connected to a member (e.g., power supply) having a potential equivalent to that of the main emitter. In this case, the potential of the power supply is variably set according to the actual potential of the main emitter.

The reverse-conducting switching element is not limited to the RC-IGBT. Any reverse-conducting switching element may be used if only the element allows the increase of voltage drop in the free-wheel diode upon application of a voltage to the gate.

An object to which the present invention is applied is not limited to a power converter circuit (inverter IV or converter CV) installed in vehicles. Further, objects to which the present invention is applied are not limited to power converter circuits.

What is claimed is:

1. A drive unit for a reverse-conducting switching element which is a driven switching element, the reverse-conducting switching element being connected to an inductor and being configured by a voltage-controlled switching element and a free-wheel diode which are mounted on a single chip, the free-wheel diode being connected in anti-parallel to the voltage-controlled switching element, the drive unit comprising:

a drive control means for turning on and off the driven switching element by performing a process to transfer electric charges to a conductive control terminal of the driven switching element on the basis of a turn-on command or a turn-off command;

an active gate control means for changing a transfer rate of the electric charges in a period from when the transfer of the electric charges to the conductive control terminal is started until when it is completed;

a judging means for judging whether or not forward current flows in the free-wheel diode;

an inhibiting means for inhibiting the electric charges from being charged to the conduction control terminal which corresponds to the free-wheel diode in which the forward current is judged to flow, while the judging means judges that the forward current flows in the free-wheel diode; and a disabling means for disabling the active gate control means for changing the transfer rate of the electric charges, while the inhibiting means inhibits the electric charges from being charged to the conduction control terminal.

2. The drive unit according to claim 1, wherein:
the active gate control means is provided with an electrical path configured to connect the conductive control terminal and a charge supply for changing the transfer rate of the electric charges;
the electrical path is provided with a switching means for opening and closing the electrical path; and
the disabling means is further configured to disable the active gate control means for changing the transfer rate of the electric charges by inhibiting the switching means from being closed.

3. The drive unit according to claim 2, wherein:
the driven switching element is provided with a sense terminal configured to output small current which is in a correlation with current flows across input/output terminals of the driven switching element;
the sense terminal is connected via a sense resistor to the output terminal of the driven switching element or a member which has a potential equal to that of the output terminal of the driven switching element;
a sense voltage, which is a potential difference across both terminals of the sense resistor, is defined as a positive when a potential of a sense terminal side terminal of both terminals of the sense resistor is larger than that of the potential of the output terminal of the driven switching element;
the electrical path is further configured to connect the conductive control terminal and a power supply which is a supply source of the electric charges; and
the active gate control means is further configured to change the transfer rate of the electric charges by controlling the switching means so as to be closed and opened on the basis of the sense voltage when the sense voltage is positive.

4. The drive unit according to claim 3, wherein:
the driven switching element is provided with a high-voltage side switching element and a low voltage side switching element, the high-voltage side switching element being connected to a positive electrode side of a direct current power supply, the low voltage side switching element being connected to a negative electrode side of the DC power supply;
the high-voltage side switching element is connected in series to the low voltage side switching element;
a connection point of a series connection of the high-voltage side switching element and the low voltage side switching element is connected the inductor;
the active gate control means is further configured to change a charge rate of the electric charges from a low charge rate to a high charge rate in a period from when a charge of the electric charges is started until when it is completed;
the drive unit further comprises:
allowing means for, if: (i) the sense voltage which corresponds to one of the high-voltage side switching element and low voltage side switching element is negative; and (ii) an absolute value of the sense voltage is equal to or more than a threshold value, allowing the active gate control means to change the charge rate when the electric charges are charged next time in the other of the high-voltage side switching element and the low voltage side switching element.

5. The drive unit according to claim 4, further comprising:
means for, if: (i) the sense voltage which corresponds to one of the high-voltage side switching element and low voltage side switching element is negative; and (ii) an absolute value of the sense voltage is less than a threshold value, performing a process to set the charge rate to the high charge rate and to charge the electric charges without allowing the active gate control means to change the charge rate when the electric charges are charged next time in the other of the high-voltage side switching element and the low voltage side switching element.

6. The drive unit according to claim 5, wherein:
the driven switching element is provided with a sense terminal configured to output small current which is in a correlation with current flows across input/output terminals of the driven switching element;
the sense terminal is connected via a sense resistor to the output terminal of the driven switching element or a member which has a potential equal to that of the output terminal of the driven switching element;
a sense voltage, which is a potential difference across both terminals of the sense resistor, is defined as negative when a potential of a sense terminal side terminal of both terminals of the sense resistor is lower than that of the potential of the output terminal of the driven switching element; and
the judging means is further configured to judge that the forward current flows on the basis of the sense voltage when the sense voltage is negative.

7. The drive unit according to claim 1, wherein:
the driven switching element is provided with a sense terminal configured to output small current which is in a correlation with current flows across input/output terminals of the driven switching element;
the sense terminal is connected via a sense resistor to the output terminal of the driven switching element or a member which has a potential equal to that of the output terminal of the driven switching element;
a sense voltage, which is a potential difference across both terminals of the sense resistor, is defined as negative when a potential of a sense terminal side terminal of both terminals of the sense resistor is lower than that of the potential of the output terminal of the driven switching element; and
the judging means is further configured to judge that the forward current flows on the basis of the sense voltage when the sense voltage is negative.

8. The drive unit according to claim 2, wherein:
the driven switching element is provided with a sense terminal configured to output small current which is in a correlation with current flows across input/output terminals of the driven switching element;
the sense terminal is connected via a sense resistor to the output terminal of the driven switching element or a member which has a potential equal to that of the output terminal of the driven switching element;
a sense voltage, which is a potential difference across both terminals of the sense resistor, is defined as negative when a potential of a sense terminal side terminal of both terminals of the sense resistor is lower than that of the potential of the output terminal of the driven switching element; and
the judging means is further configured to judge that the forward current flows on the basis of the sense voltage when the sense voltage is negative.

9. The drive unit according to claim 3, wherein:
the driven switching element is provided with a sense terminal configured to output small current which is in a correlation with current flows across input/output terminals of the driven switching element;
the sense terminal is connected via a sense resistor to the output terminal of the driven switching element or a member which has a potential equal to that of the output terminal of the driven switching element;

a sense voltage, which is a potential difference across both terminals of the sense resistor, is defined as negative when a potential of a sense terminal side terminal of both terminals of the sense resistor is lower than that of the potential of the output terminal of the driven switching element; and the judging means is further configured to judge that the forward current flows on the basis of the sense voltage when the sense voltage is negative.

10. The drive unit according to claim 4, wherein:

the driven switching element is provided with a sense terminal configured to output small current which is in a correlation with current flows across input/output terminals of the driven switching element;

the sense terminal is connected via a sense resistor to the output terminal of the driven switching element or a member which has a potential equal to that of the output terminal of the driven switching element;

a sense voltage, which is a potential difference across both terminals of the sense resistor, is defined as negative when a potential of a sense terminal side terminal of both terminals of the sense resistor is lower than that of the potential of the output terminal of the driven switching element; and the judging means is further configured to judge that the forward current flows on the basis of the sense voltage when the sense voltage is negative.

11. A drive method for a reverse-conducting switching element which is a driven switching element, the reverse-conducting switching element being connected to an inductor and being configured by a voltage-controlled switching element and a free-wheel diode which are mounted on a single chip, the free-wheel diode being connected in anti-parallel to the voltage-controlled switching element, the drive method comprising:

turning on and off the driven switching element by performing a process to transfer electric charges to a conductive control terminal of the driven switching element on the basis of a turn-on command or a turn-off command;

changing a transfer rate of the electric charges in a period from when the transfer of the electric charges to the conductive control terminal is started until when it is completed;

judging whether or not forward current flows in the free-wheel diode;

inhibiting the electric charges from being charged to the conduction control terminal which corresponds to the free-wheel diode in which the forward current is judged to flow, while the forward current is judged to flow in the free-wheel diode; and disabling a change of the transfer rate, while the electric charges are inhibited from being charged to the conduction control terminal.

12. A system, comprising:

a reverse-conducting switching element that is connected to an inductor and is configured by a voltage-controlled switching element and a free-wheel diode which are mounted on a single chip, the free-wheel diode being connected in anti-parallel to the voltage-controlled switching element; and a drive unit for driving the reverse-conducting switching element which is a driven switching element, comprising:

a drive control means for turning on and off the driven switching element by performing a process to transfer electric charges to a conductive control terminal of the driven switching element on the basis of a turn-on command or a turn-off command;

an active gate control means for changing a transfer rate of the electric charges in a period from when the transfer of the electric charges to the conductive control terminal is started until when it is completed;

a judging means for judging whether or not forward current flows in the free-wheel diode;

an inhibiting means for inhibiting the electric charges from being charged to the conduction control terminal which corresponds to the free-wheel diode in which the forward current is judged to flow, while the judging means judges that the forward current flows in the free-wheel diode; and a disabling means for disabling the active gate control means for changing the transfer rate of the electric charges, while the inhibiting means inhibits the electric charges from being charged to the conduction control terminal.

\* \* \* \* \*